(12) United States Patent
Hadidi

(10) Patent No.: US 9,196,463 B2
(45) Date of Patent: Nov. 24, 2015

(54) SYSTEM AND METHOD FOR PLASMA MONITORING USING MICROWAVES

(75) Inventor: Kamal Hadidi, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 911 days.

(21) Appl. No.: 13/081,680

(22) Filed: Apr. 7, 2011

(65) Prior Publication Data

US 2012/0255491 A1 Oct. 11, 2012

(51) Int. Cl.
*G01R 31/00* (2006.01)
*H01J 37/32* (2006.01)

(52) U.S. Cl.
CPC .................. *H01J 37/32935* (2013.01)

(58) Field of Classification Search
None
See application file for complete search history.

(56) References Cited

U.S. PATENT DOCUMENTS

| | | | | |
|---|---|---|---|---|
| 3,353,060 | A | * | 11/1967 | Yamamoto et al. ....... 315/111.31 |
| 5,691,642 | A | * | 11/1997 | Dobkin .......................... 324/464 |
| 5,810,963 | A | | 9/1998 | Tomioka |
| 6,060,329 | A | | 5/2000 | Kamata et al. |
| 6,826,489 | B2 | * | 11/2004 | Scanlan et al. ................... 702/38 |
| 7,314,537 | B2 | * | 1/2008 | Baldwin et al. .......... 156/345.28 |
| 7,709,247 | B2 | * | 5/2010 | Koo et al. ................... 435/287.1 |
| 8,242,789 | B2 | * | 8/2012 | Daniels et al. ................ 324/642 |
| 2003/0085662 | A1 | * | 5/2003 | Kwon et al. ............. 315/111.21 |
| 2003/0141822 | A1 | | 7/2003 | Sirkis et al. |
| 2004/0035529 | A1 | * | 2/2004 | Grimbergen ............. 156/345.24 |
| 2010/0062547 | A1 | | 3/2010 | Hadidi et al. |
| 2010/0219757 | A1 | * | 9/2010 | Benzerrouk .......... H01J 37/321 315/111.51 |
| 2010/0331194 | A1 | * | 12/2010 | Turner et al. ....................... 506/2 |

* cited by examiner

*Primary Examiner* — Paresh Patel

(57) ABSTRACT

A plasma detector system may include a high frequency generator arranged to send incident electromagnetic radiation through a plasma chamber of a plasma system; and a high frequency detection system arranged to detect signal intensity of high frequency radiation sent from the high frequency generator and transmitted through the plasma chamber.

14 Claims, 6 Drawing Sheets

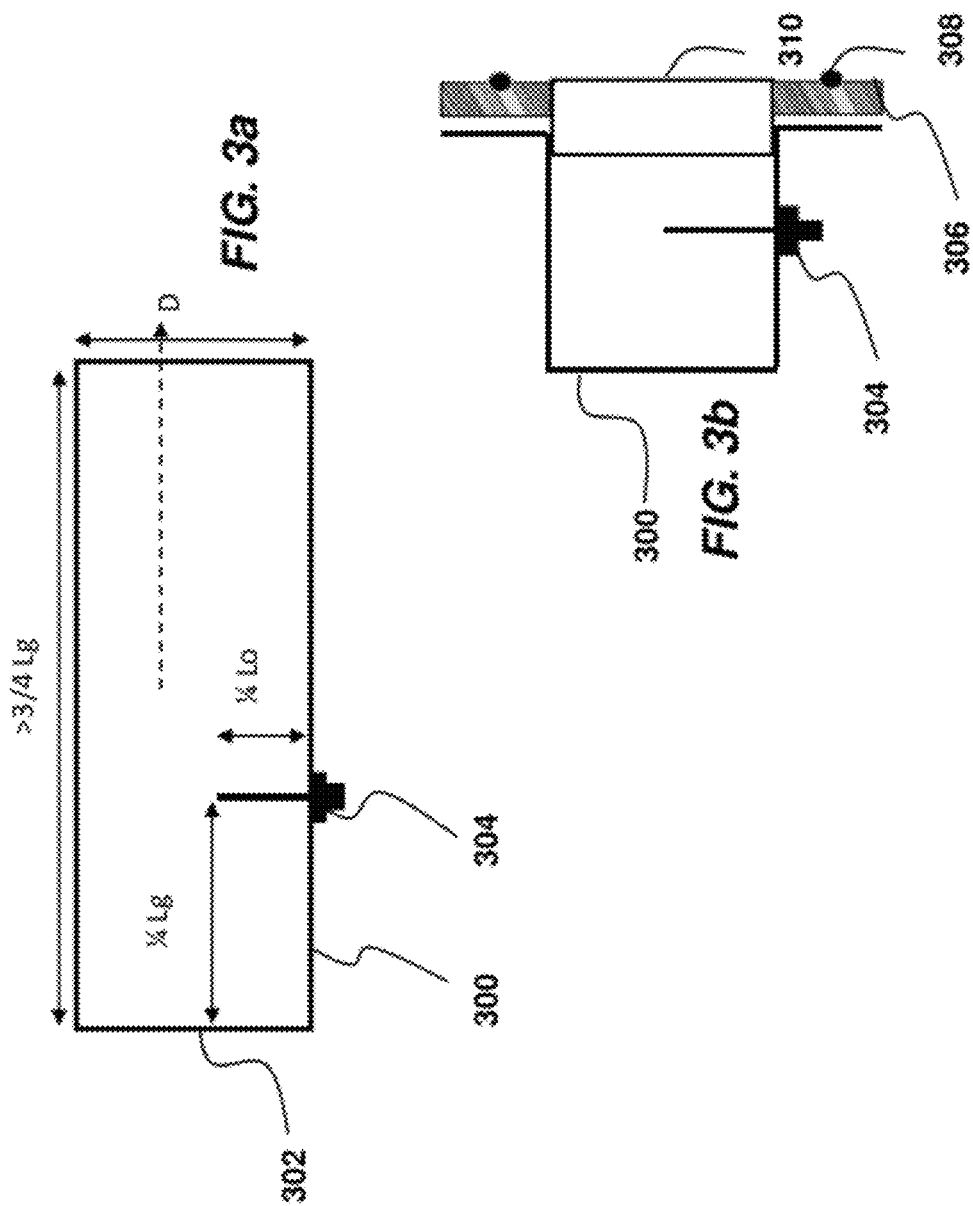

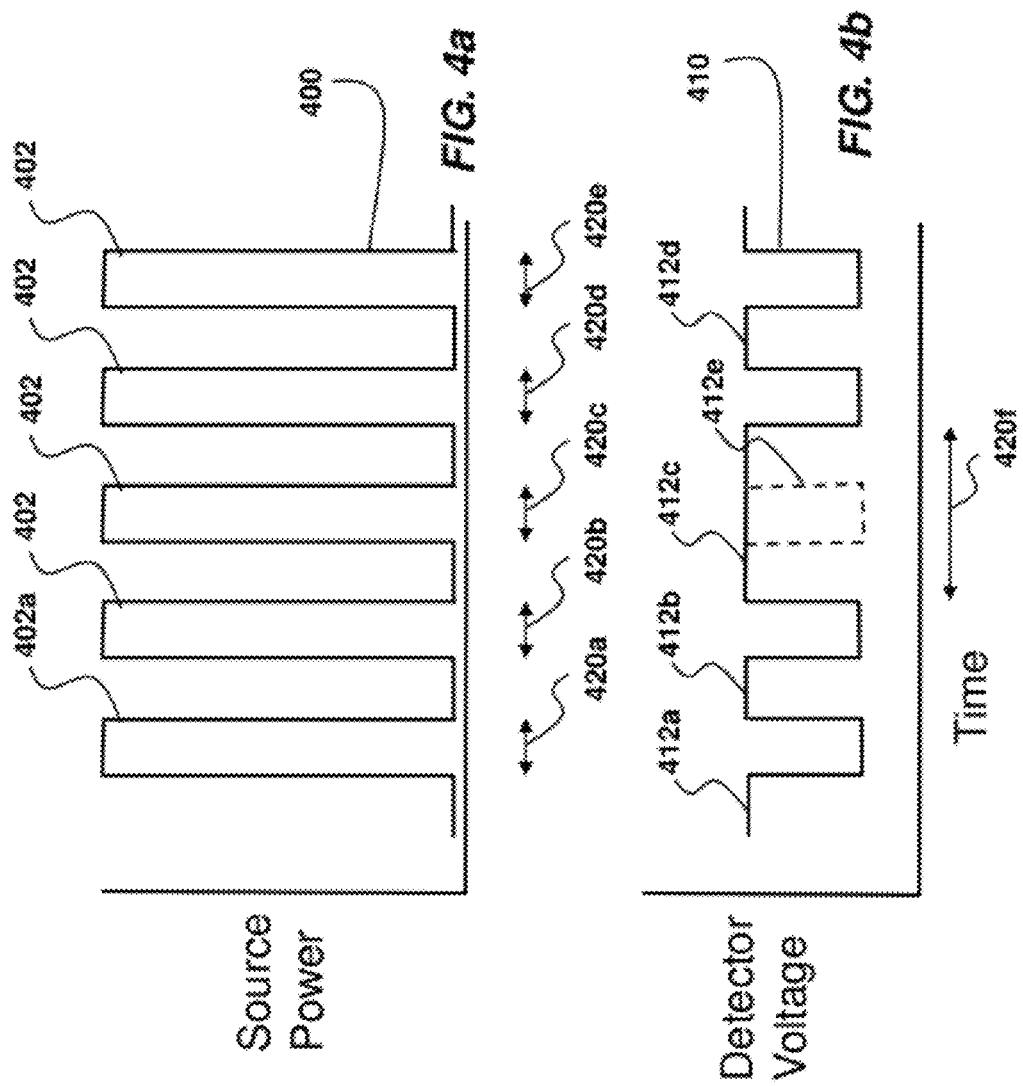

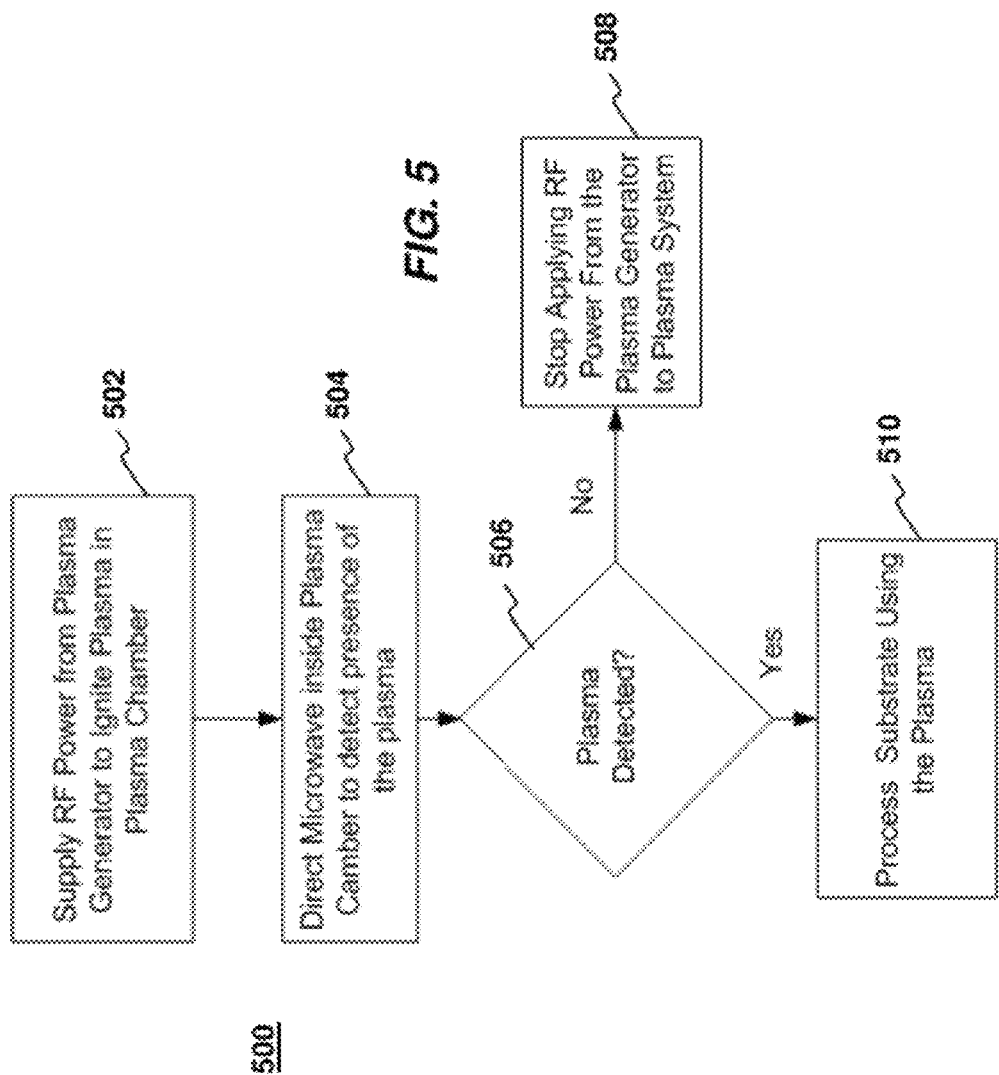

SYSTEM AND METHOD FOR PLASMA MONITORING USING MICROWAVES

BACKGROUND OF THE INVENTION

1. Field of the Invention

Embodiments of the invention relate to the field of plasma processing. More particularly, the present invention relates to a method and system for monitoring plasmas.

2. Discussion of Related Art

In plasma-based processing tools, power is input through a series of hardware components that couple the power into a plasma. When the plasma is ignited a large fraction of the input power may be dissipated into the plasma, which serves as a load. However, when the plasma is extinguished, applied power may be dissipated in hardware components and may damage components, such as dielectric windows, matching network, and generator. It may therefore be desirable to monitor a plasma to minimize the time during which a plasma is absent while power is being generated.

In many known plasma systems, detectors, such as optical detectors, are used to aid in monitoring the plasma in a plasma processing chamber. Such detectors are typically located external to the plasma chamber and may be mounted adjacent to transparent windows through which optical signals to and from the plasma can propagate. However, in the case of plasma processes that involve material deposition, the optical window may become opaque after a period of material deposition, causing the optical detection system to fail to properly detect the presence or absence of a plasma.

FIG. 1 is a schematic illustration of a known plasma system 10 that may be used for ion implantation. As depicted, plasma system 10 is arranged as a plasma doping (PLAD) system that comprises a process chamber 12 having a pedestal or platen 14 to support an insulated target substrate 5. One or more reactive gases containing the desired dopant characteristics are fed into the process chamber 12 via a gas inlet 13 through a top plate 18 of the chamber. The reactive gas may be, for example, BF3, B2H6, PH3, etc. The reactive gas(es) may then be distributed uniformly via baffle 11 before entering the process chamber 12. A group of coils 16 which together with the walls of chamber 12 form an anode may couple radio frequency (RF) electrical power into the process chamber 12 through an aluminum oxide ($Al_2O_3$) window 17. The RF power produces a dopant-containing plasma 20 from the reactive gas(es). A bias voltage is applied to the target substrate 5 via the platen 14 to draw charged particles from the plasma 20. The platen 14 is electrically insulated from chamber walls of system 10 and the target substrate is kept at a negative potential to attract the positively charged ions of the plasma. Typically, the substrate 5 is biased with a pulsed DC voltage to act as a cathode. As a result, dopant ions are extracted from the plasma 20 across a plasma sheath disposed between plasma 20 and a top surface of substrate 5. The ions are implanted into the substrate 5 during the bias pulse-on periods. Generally, an ion dose is the amount of ions implanted into the target substrate or the integral over time of the ion current. The bias voltage corresponds to the implantation depth of the ions which may also be influenced by the pressure and flow rate of the reactive gas introduced into process chamber 12, duration of the bias voltage, etc. System 10 also includes an optical monitor 28, which may be used to monitor a plasma during processing.

Because plasma system may employ reactive gases such as BF3, B2H6, PH3, etc., during operation of implantation system 10, products of such gases may condense on walls of process chamber 12. With sufficient time, such condensates may form opaque films on surfaces including any optically transparent windows that otherwise facilitate monitoring of the plasma 20. In this manner, any initially transparent windows of process chamber 12 may become substantially opaque during operation, such that visible radiation from plasma is not transmitted outside the chamber, thereby preventing optical monitoring of the plasma using optical monitor 28. Accordingly, any anomalies, such as the failure of a plasma to ignite when subject to RF power, may be undetectable. Moreover, if optical monitoring is used to control a plasma process, the accumulation of opaque material on an initially transparent window may reduce the light signal from a plasma to the point where the optical monitor 28 determines that a plasma is no longer present. Even though a plasma is actually present, the optical detector may inadvertently trigger a shutdown of source power if system controls are set to power down when a plasma extinguishes. In view of the above, it will be appreciated that there is a need to improve monitoring of plasma processes, including those that involve material deposition.

SUMMARY OF THE INVENTION

Embodiments of the present invention are directed to methods and systems for monitoring a plasma. In one embodiment, a plasma detector system comprises a high frequency generator arranged to send incident electromagnetic radiation through a plasma chamber of a plasma system; and a high frequency detection system arranged to detect signal intensity of high frequency radiation sent from the high frequency generator and transmitted through the plasma chamber. In another embodiment, a method of monitoring a plasma in a plasma chamber of a plasma system, comprises transmitting high frequency radiation through the plasma chamber, arranging an exit portal to pass the high frequency radiation transmitted through the plasma chamber, and detecting a signal intensity of the high frequency radiation intensity passed through the exit portal.

BRIEF DESCRIPTION OF THE DRAWINGS

FIG. 3a illustrates an embodiment of a waveguide antenna.
FIG. 3b illustrates an embodiment of a waveguide antenna showing details of coupling to a chamber.
FIG. 4a depicts an exemplary plasma power curve used in an exemplary pulsed plasma system.
FIG. 4b depicts an exemplary plasma detection curve corresponding to the power curve of FIG. 4a, illustrating detection of a plasma failure.
FIG. 5 depicts a method of monitoring a plasma.

DESCRIPTION OF EMBODIMENTS

Figure 1:
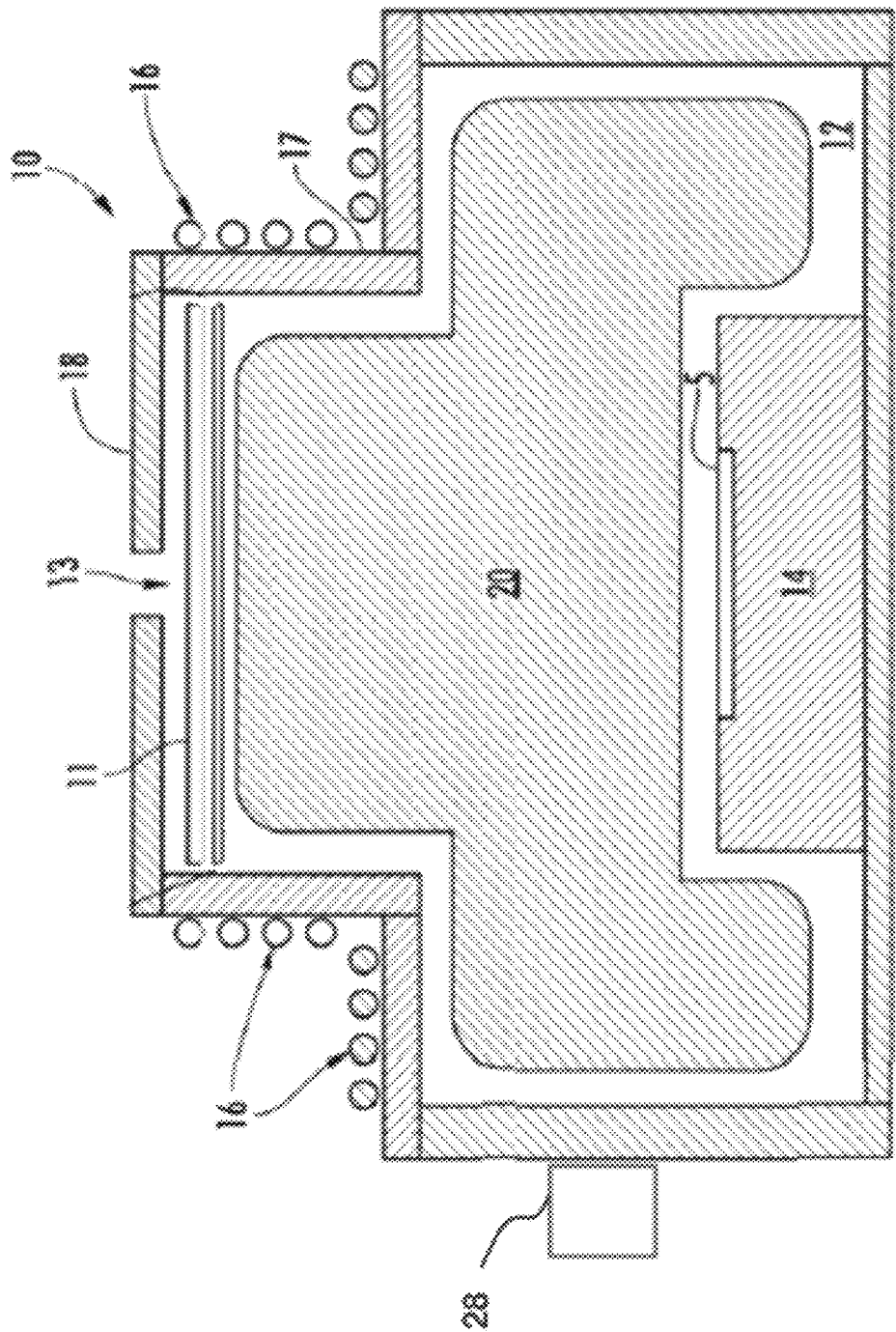
FIG. 1 depicts a prior art plasma system.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for detecting a plasma are introduced. In particular, the present disclosure involves techniques for monitoring a plasma using high frequency radiation. As used herein the term "high frequency radiation" refers to electromagnetic radiation having frequency (or wavelength) generally in the microwave range or the very high frequency end of the RF spectrum.

In various embodiments, a plasma detection system may include a high frequency radiation generator and a high frequency radiation detector. The high frequency radiation generator may be arranged to transmit high frequency radiation through a plasma chamber of a plasma system. In particular embodiments, the generator may be arranged to transmit high frequency radiation through a plasma zone. In particular, referring again to FIG. 1, this zone may be the region in a process chamber 12 in which a plasma 20 is located under normal operation. In some embodiments, a high frequency radiation generator may be mechanically coupled to a plasma chamber wall of a plasma system. Likewise, in some embodiments, the high frequency radiation detector may be mechanically coupled to the plasma chamber wall.

In various embodiments, the high frequency radiation generator and detector operate to determine the presence or absence of a plasma in a plasma chamber by measurement of the intensity of high frequency radiation received at the high frequency radiation detector. In exemplary embodiments, the high frequency radiation detector may be arranged to detect radiation over a particular frequency range, which may closely match the frequency or range of frequencies of radiation emitted by the high frequency radiation generator. In this manner, the high frequency radiation detector may specifically track changes in the amount of radiation emitted from the high frequency radiation generator that is transmitted through a plasma chamber. In the presence of a plasma, for example, as explained further below, the amount of high frequency radiation transmitted through a plasma chamber may be substantially less than when a plasma is not present. Accordingly, various embodiments may determine the presence or absence of a plasma based upon the detected signal intensity at the high frequency radiation detector.

Figure 2A:
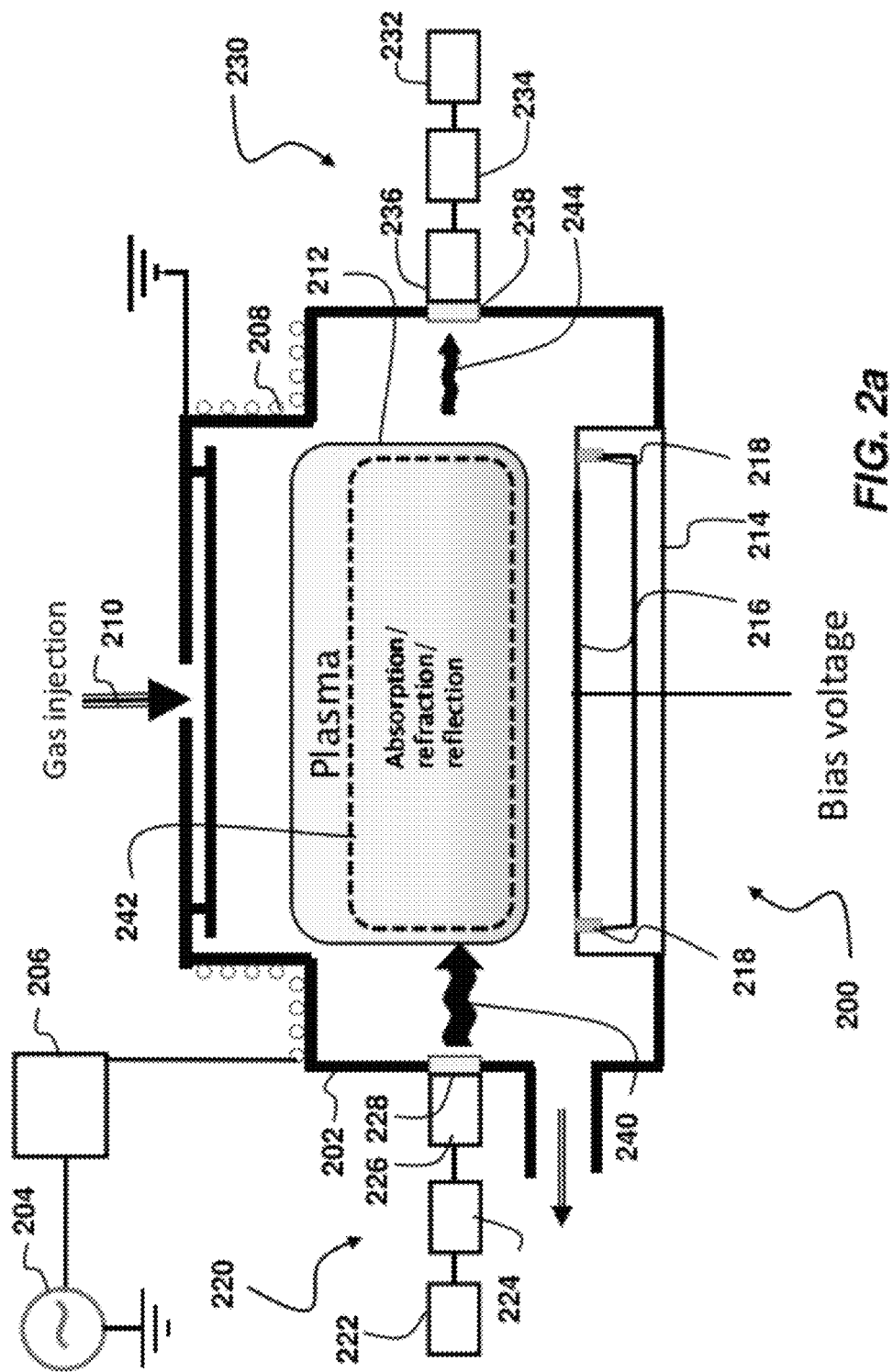
FIG. 2a depicts an embodiment of a plasma system.

FIG. 2a depicts one embodiment of a plasma system 200 that includes an exemplary high frequency radiation generator 220 and a high frequency radiation detection system 230, each coupled to plasma chamber 202. Plasma system 200 may comprise a known configuration of components save for the high frequency radiation generator 220 and high frequency radiation detection system 230. In some embodiments, plasma system 200 may be an RF-plasma system, for example, and inductively coupled system. In the example specifically depicted in FIG. 2a, a plasma generator 204 may be an RF generator that is coupled to a matching network 206 used to send a signal to coils 208. A gas stream 210 may be provided from which ions are formed in plasma 212.

In accordance with various embodiments, plasma system 200 may be arranged for various purposes, such as material deposition, etching of a substrate (workpiece), or ion implantation of a substrate. In some embodiments, plasma system 200 may be operated as a PLAD system described above with respect to FIG. 1. A substrate holder system 214 may support a substrate 216, as well as detectors 218, which may be conventional ion (current) detectors. In some embodiments, a bias voltage may be supplied to substrate 216 to provide a potential difference between plasma 212 and substrate 216 so as to attract ions from plasma 212 for the purposes of ion implantation into substrate 216. In some embodiments, a pulsed biasing may be applied between substrate 216 and plasma 212.

In accordance with various embodiments, radiation generator 220 is arranged to send incident radiation 240 into plasma chamber 202 such that the radiation enters plasma 212 when the plasma is present. In some embodiments, incident radiation 240 may spread out in a forward direction from radiation generator 220 to detection system 230, such that the radiation may be present in a large portion of the plasma chamber 202. Accordingly, high frequency radiation generator 220 need not be precisely arranged in any particular location on plasma chamber 202 in order to ensure that some incident radiation 240 traverses a plasma and is detected by detection system 230.

However, by proper location of high frequency radiation generator 220, a larger fraction of incident radiation 240 may be assured of passing through a plasma 212 when present in plasma chamber 202. In some embodiments, the radiation generator 220 may be arranged to send incident radiation 240 through a plasma zone 242, which may represent a region of plasma chamber 202 in which at least a portion of plasmas are always located when present. It is well known that varying plasma operating conditions such as pressure and applied voltages may vary the extent and exact location of a plasma within a given chamber. For example, the dimensions of the plasma sheath may vary substantially with operating conditions. Thus, the exact size of plasma 212 in plasma chamber 202 may vary when different plasma conditions are used. However, under most or all conditions, plasmas may occupy certain portions of the plasma chamber 202 once ignited, such as, for example, a central region, as suggested by plasma zone 242. Thus, by locating high frequency radiation generator 220 and high frequency radiation detection system 230 opposite one another and in a plane that intersects plasma zone 242, the transmitted radiation 244 that is detected is assured of passing though a plasma 212, if present, under all operating conditions of plasma system 200.

In accordance with various embodiments, the incident radiation 240 is arranged to couple to plasma 212, such that the radiation is at least partially absorbed, refracted, and/or reflected. In this manner, plasma 212 reduces radiation transmitted towards high frequency radiation detection system 230, such that any high frequency radiation transmitted through plasma zone 242 (that is, transmitted radiation 244) is diminished in intensity when plasma 212 is present in comparison to its intensity when no plasma is present.

As further illustrated in FIG. 2a, high frequency radiation generator 220 may include an oscillator 222, amplifier 224, and antenna 226. In some embodiments, oscillator 222 may be a solid state device, such as a solid state voltage controlled oscillator. In some embodiments, oscillator 222 may generate a high frequency electrical signal in the megahertz or gigahertz range. The amplified electrical signal may be fed to antenna 226, which is arranged to transform the signal into radio frequency or microwave radiation. In various embodiments, one or more high frequency radiation generator components, including oscillator 222, amplifier 224, and antenna 226, may be commercially available items. In one example, oscillator 222 may be a commercial device operating in the gigahertz range, for example, in the range of about 2-10 GHz. In some embodiments, high frequency radiation generator 220 may be mechanically coupled to plasma chamber 202 using, for example, a quartz window 228 or other non-metallic port.

In various embodiments, high frequency radiation detection system 230 may include detector antenna 236, amplifier 234, and high frequency electrical signal detector 232 (or "high frequency detector" 232). Each of these components may also be commercially available components in some embodiments. In some embodiments, high frequency electrical signal detector 232 may be arranged to detect and process signals in the 200 MHz to 10 GHz range. In particular embodiments, high frequency electrical signal detector 232 may be arranged to detect signals having frequency ranges up to an upper frequency corresponding to the upper frequency range of oscillator 222. In some embodiments, high frequency radiation detection system 230 may be mechanically coupled to plasma chamber 202 using, for example, a quartz window 238 or other non-metallic port.

Although embodiments of high frequency radiation generators and detectors may operate at frequencies below 1 GHZ, higher frequency generators and detectors may be preferable, among other reasons, because of more compact antenna design afforded by the higher frequencies (that is, shorter wavelengths). For example, at 6.8 GHz, the radiation wavelength is about 45 mm, while at 1 GHz the radiation wavelength is about 265 mm, requiring a longer antenna (at least about ¼ wavelength).

In operation, high frequency radiation generator 220 and high frequency radiation detection system 230 may be interoperable to probe the presence of a plasma 212 and/or monitor the plasma during processing. In various embodiments, the frequency of high frequency radiation emitted by radiation generator 220 may be higher than the plasma frequency of plasma 212. However, in some embodiments the frequency of high frequency radiation generator 220 may be comparable to the plasma frequency.

As detailed below, plasma 212 may act to change the refractive index of the plasma chamber ambient, and may cause reflection and/or absorption of radiation sent from high frequency radiation generator 220. In this manner, the intensity of incident radiation 240 that is transmitted through plasma 212 may be reduced, as indicated by transmitted radiation 244.

The refractive index $\mu_r$ of the plasma for an incident wave with an angular frequency of $\omega$ can be expressed as $$\mu_r = \left(1 - \frac{\omega_p^2}{\omega^2}\right) \quad (1)$$

where $\omega_p$ is the angular plasma frequency. The plasma frequency may vary, in turn, with parameters such as electron (e) density $n_e$ as given by $$\omega_p = \sqrt{\frac{n_e e^2}{\epsilon_0 m_e}} \quad (2)$$

where $\epsilon_0$ is free space permittivity.

Under many plasma operating conditions, the plasma frequency may be in the range of 1 GHz. One characteristic of the plasma frequency is that electromagnetic waves incident on a plasma are completely reflected if the electromagnetic radiation frequency is below the plasma frequency, that is, if $\omega<\omega_p$. On the other hand, if $\omega>\omega_p$ the electromagnetic radiation may be at least partially transmitted by the plasma. Thus, in accordance with Eqs 1) and 2) above, incident radiation 240 may be reflected or refracted by plasma 212 to a lesser or greater extent depending on the relative frequencies of the incident radiation 240 and plasma 212, the latter of which, may, in turn, depend on operating parameters of plasma system 200 that influence the electron density. Such parameters may include, among others, the gas pressure, applied power, and gas species in the plasma 212.

FIG. 3a illustrates one embodiment of an antenna 300 that may be used in a high frequency radiation generator or detector. Antenna 300, which may be an embodiment of antennae 226, 236, includes a closed end 302 and probe 304 and is configured as a waveguide antenna having a diameter D and length greater than ¾ $L_g$, where $L_g$ is the standing wavelength inside a waveguide antenna. Antenna feed is spaced at ¾ $L_g$ distance from an outer end of antenna 300, and extends a distance of about ¼ $L_o$ into the waveguide, where $L_o$ is the radiation wavelength in open air (44.11 mm at 6.8 GHz). Accordingly, embodiments in which a radiation frequency of radiation generator 220 is in the range of several GHZ up to about 10 GHz can employ relatively compact waveguide antennae whose diameter and length are on the order of several centimeters. In some embodiments, a compact generator antenna 226 or detector antenna 236 may be coupled to a small portal in a plasma chamber, such as a round portal having a diameter in the range of several centimeters. FIG. 3b illustrates an embodiment in which antenna 300 is coupled to a chamber wall (not shown) using a flange 306 and O-ring 308 seal that clamps antenna 300 to window 310, which may be silica based glass, quartz, or other non-metallic material.

Referring again to FIG. 2a, waveguide antenna 300 as embodied in antennae 226 and/or 236 may provide an efficient arrangement to launch incident radiation 240 that is microwave radiation and is generally directed into plasma chamber 202, as well as an efficient way to detect transmitted radiation 244. This may facilitate operating high frequency radiation generator 220 at low power levels. In some embodiments, the power level of high frequency radiation generator 220 may be less than about 1 W, and in particular on the order of 1 mW, such as between 0.1-10 mW.

Thus, the present invention provides a means to probe a plasma, which may be driven by power levels on the order of 1000 W, with minimal perturbation. Moreover, even at such low power levels, the detected radiation may be sufficient to produce substantial voltage signals at high frequency radiation detection system 230. In one implementation, a 6.8 GHz voltage controlled oscillator coupled to an antenna as described hereinabove has been used to launch microwaves to probe a 575 W plasma operating at 6 mTorr pressure. Under these operating conditions, the voltage signal at a detector that was produced by transmitted microwave radiation was measured with and without a plasma present. The difference in detected voltage amounted to about 720 mV, which signal is about a couple orders of magnitude above a detection threshold easily available in low-cost detector systems. In various embodiments, the detected voltage differences corresponding to the intensity of microwave signals detected with and without a plasma present may be greater than 1 mV, and in particular up to about 1 V or more.

In accordance with some embodiments, a plasma detection system may be used to monitor pulsed plasmas, such as pulsed plasma systems used for ion implantation. FIG. 4 illustrates an exemplary power curve 400 that may represent the applied source power to a plasma chamber as a function of time. As illustrated, a series of regularly spaced pulses 402 are applied that are interspersed with periods in which no power is applied. Each pulse 402 is applied for a duration 420 during which a plasma may form in the plasma chamber under normal operating conditions. However, if the plasma system fails to function as designed, the plasma may fail to ignite during a power pulse. FIG. 4b illustrates an exemplary detector curve, which displays a voltage derived from a high frequency radiation detector. As shown, during power "on" periods 420, the detector voltage is relatively lower, due to a greater attenuation of the high frequency radiation by the plasma, as discussed above. During periods in which the plasma is off, the detected voltage is relatively higher due to the lesser attenuation of high frequency radiation. In particular, as illustrated in voltage curve peak 412*c*, the detected voltage may remain high even during period 420*c*, which corresponds to a high applied source power. In other words, the wide voltage curve peak 412*c* in high voltage over the entire period 420*f* is in contrast to the expected detector voltage trough 412*e*, which would be produced in the presence of a plasma. This may indicate a failure of the plasma to ignite, which would not be detected by examination of applied power curve 400.

It is to be noted that FIG. 4*b* presents a voltage curve that may, in some cases, be idealized. For example, as a pulsed plasma is ignited and extinguished, there may be a gradual decay of the plasma. Accordingly, the level of microwave radiation transmitted through a plasma may also gradually rise as the plasma extinguishes. Thus, the voltage curve peaks 412 in voltage curve 410 may in some cases be less abrupt, and the exact shape of the peaks may provide further information concerning transient behavior of the plasma, such as afterglow.

In some embodiments, the detected voltage information, such as that displayed in FIG. 4*b*, may be recorded and stored in a computer readable memory to form a plasma history. The information may be stored in any convenient format, such as, for example, a tabular format that includes time and detected voltage.

Figure 2B:
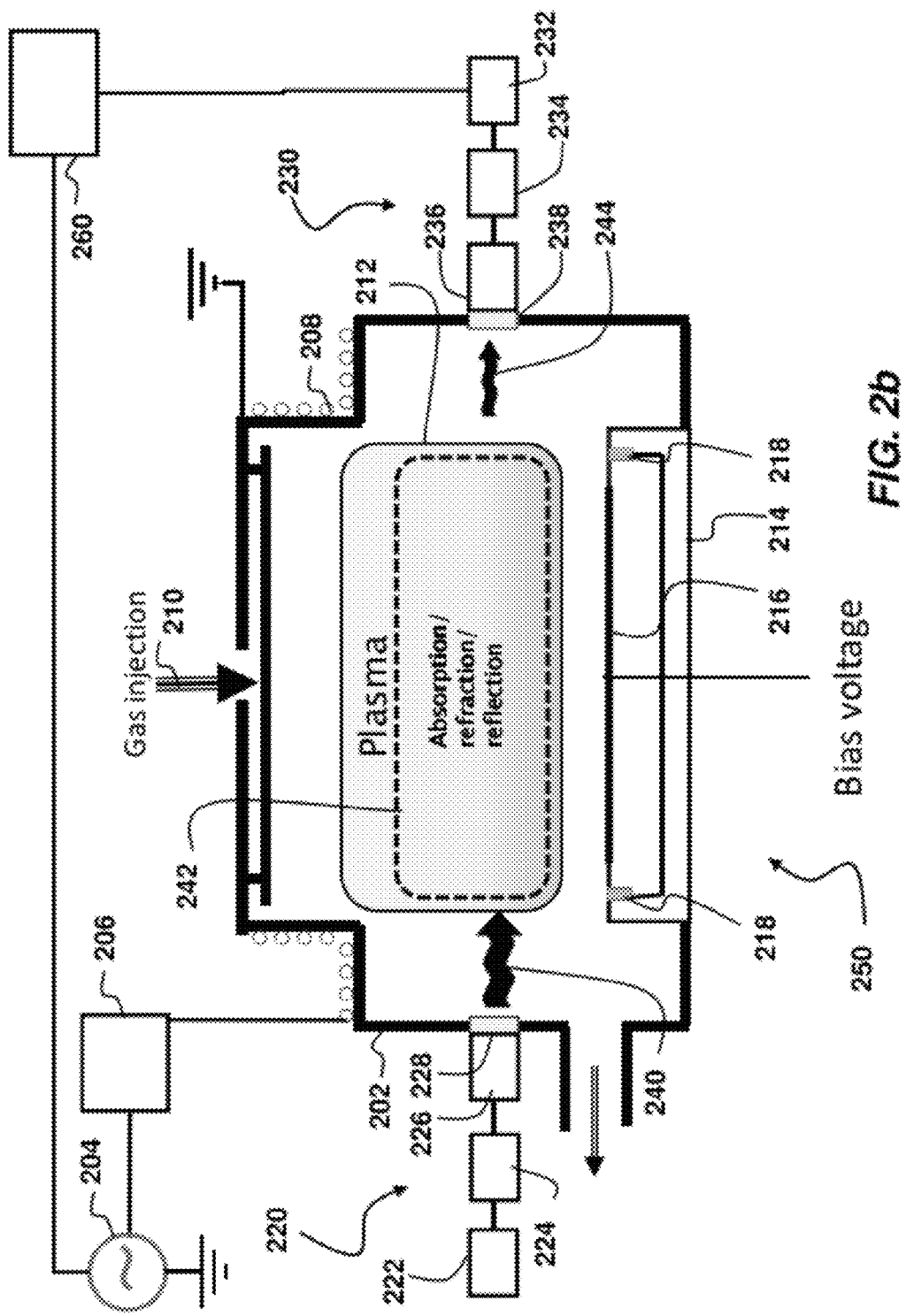
FIG. 2b depicts another embodiment of a plasma system.

In various embodiments, a plasma system includes a controller to regulate the power applied to the plasma system according to whether a plasma is detected within the system. FIG. 2*b* depicts an exemplary embodiment of plasma system 250, which includes the aforementioned components of plasma system 200 as well as a controller 260 electrically coupled to high frequency electrical signal detector 232. When a plasma is ignited in chamber 202, the signal detected by high frequency electrical signal detector 232 represents the presence of a plasma. When a plasma extinguishes and the signal level detected by high frequency electrical signal detector 232 increases, a triggering signal may be sent to controller 260 representing the fact that no plasma is detected. Upon receiving the triggering signal, controller 260 may shut off power to the plasma system. For example, controller 260 may be configured to send a signal to plasma generator 204 to switch off the power supplied by plasma generator 204 to plasma system 250.

FIG. 5 depicts on embodiment of a method 500 for monitoring a plasma. At block 502, RF power is supplied from a plasma generator to ignite a plasma in a plasma chamber. At block 504, a high frequency radiation generator, such as a microwave generator, directs high frequency radiation, such as microwave radiation, into the plasma chamber to detect the presence of a plasma, as described hereinabove. At block 506, if a plasma is detected, for example, using the aforementioned high frequency radiation detection system, the process moves to block 510 where a substrate is processed using the plasma. However, if at block 506 no plasma is detected, the method moves to block 508 where RF power is no longer applied from the plasma generator to the plasma system. This may be accomplished, as discussed above, by sending a signal from a high frequency radiation detector to a controller indicating that no plasma was detected which may trigger the controller to send a signal to turn off the plasma generator.

The aforementioned system and method for shutting off RF power to a plasma system may be especially useful to prevent damage to plasma source components that would otherwise occur if RF power is continuously supplied to plasma source components when no plasma is present in a plasma chamber to absorb the RF load. Because such high frequency detection systems as disclosed herein may detect the absence of a plasma as soon as the plasma extinguishes, a signal to shut off RF power may be sent very rapidly before system plasma source components can sustain damage.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

In particular, steps for generating microwaves using a generator, detecting radiation, and storing signal information derived from the detected radiation, such as voltage values, may be performed at least partially by a combination of an electronic processor, computer readable memory, and/or computer readable program. The computer memory may be further configured to receive, display and store process history information associated with operation of a plasma system and as exemplified by the stored voltage values.

In summary, the present embodiments provide novel and inventive methods and systems for probing plasmas such as those found in plasma processing systems, including ion implanters. The present invention also provides a probe system that produces a minimal perturbation of the plasma being studied while yielding an easily resolvable difference in detected signal strength with and without a plasma present. Moreover, systems of the present invention are operable under conditions in which a chamber window(s) may be opaque to visible radiation. Thus, the present invention provides uninterrupted real-time monitoring of continuous or pulsed plasmas including those involving material deposition that may produce opaque coatings on window surfaces during processing. In addition, the present invention may facilitate more efficient tool usage by eliminating false indications of plasma failures that may occur when windows used by external optical monitors become opaque during processing.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. Although the present invention may be deployed in plasma systems in which a generator and detector are arranged in a line-of-sight fashion, other configurations are possible as long as the detector is arranged to detect at least a portion of radiation emitted by the generator and transmitted through the plasma chamber.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of monitoring a plasma generated in a plasma chamber of a plasma system, comprising:
   transmitting high frequency radiation through a plasma chamber generated during operation of the plasma system toward an exit portal, wherein transmitting the high frequency radiation comprises receiving a high frequency electrical signal at an antenna;
   detecting a signal intensity of the high frequency radiation passed through the exit portal, wherein detecting the signal intensity of the high frequency radiation comprises:
      generating a high frequency electrical signal from a high frequency radiation; and
      converting the high frequency electrical signal into a voltage,
      wherein said voltage is a first voltage corresponding to a first signal intensity of the high frequency radiation when a plasma is present in the plasma chamber and a second voltage corresponding to a second intensity of the high frequency radiation when a plasma is not present in the plasma chamber such that the first voltage is less than the second voltage; and
   sending a trigger signal to shut off power to the plasma system when the signal intensity indicates that no plasma is detected.

2. The method of claim 1, further comprising:
   sending microwave radiation from the antenna through the plasma chamber.

3. The method of claim 2, wherein the antenna comprises a waveguide antenna mechanically coupled to an entrance portal of the plasma chamber.

4. The method of claim 1, wherein an incident power of the high frequency radiation is less than 1 W, and a difference between the first and second voltage is greater than 1 mV.

5. The method of claim 1, further comprising:
   detecting the second voltage; and
   sending a signal to shut off a plasma generator that supplies power to generate the plasma when said second voltage is detected.

6. The method of claim 1, further comprising storing time and signal intensity values in a memory.

7. A method of monitoring a plasma generated in a plasma chamber of a plasma system, comprising:
   transmitting high frequency radiation through a plasma chamber during operation of the plasma system toward an exit portal; and
   detecting a signal intensity of the high frequency radiation passed through the exit portal,
   wherein transmitting the high frequency radiation comprises:
      generating a high frequency electrical signal;
      receiving the high frequency electrical signal at an antenna; and
      sending microwave radiation from the antenna through the plasma chamber, wherein the detecting signal intensity of the high frequency radiation comprises:
         receiving high frequency radiation transmitted through the plasma chamber at a receiver antenna;
         generating a high frequency electrical signal from the received high frequency radiation; and
         converting the high frequency electrical signal into a corresponding voltage,
      wherein said voltage is a first voltage corresponding to a first signal intensity of the high frequency radiation when a plasma is present in the plasma chamber and a second voltage corresponding to a second signal intensity of the high frequency radiation when a plasma is not present in the plasma chamber such that the first voltage is less than the second voltage.

8. The method of claim 7, wherein an incident power of the high frequency radiation is less than 1 W, and a difference between the first and second voltage is greater than 1 mV.

9. The method of claim 7, further comprising:
   detecting the second voltage; and
   sending a signal to shut off a plasma generator that supplies power to generate the plasma when said second voltage is detected.

10. The method of claim 7, wherein transmitting the high frequency radiation comprises:
    generating a high frequency electrical signal;
    receiving the high frequency electrical signal at an antenna; and
    sending microwave radiation from the antenna through the plasma chamber.

11. The method of claim 7, wherein the antenna comprises a waveguide antenna mechanically coupled to an entrance portal of the plasma chamber.

12. The method of claim 7, wherein an incident power of the high frequency radiation is less than about 1 W, and a difference between the first and second voltage is greater than 1 mV.

13. The method of claim 7, further comprising:
    detecting the second voltage; and
    sending a signal to shut off a plasma generator that supplies power to generate the plasma when said second voltage is detected.

14. The method of claim 7, further comprising storing time and signal intensity values in a memory.

* * * * *